(12) United States Patent
Fukunaga (10) Patent No.: US 11,129,304 B2
(45) Date of Patent: Sep. 21, 2021

(54) ELECTRONIC DEVICE

(71) Applicant: FUJITSU LIMITED, Kawasaki (JP)

(72) Inventor: Naomi Fukunaga, Kawasaki (JP)

(73) Assignee: FUJITSU LIMITED, Kawasaki (JP)

( * ) Notice: Subject to any disclaimer, the term of this patent is extended or adjusted under 35 U.S.C. 154(b) by 0 days.

(21) Appl. No.: 15/724,295

(22) Filed: Oct. 4, 2017

(65) Prior Publication Data

US 2018/0116075 A1   Apr. 26, 2018

(30) Foreign Application Priority Data

Oct. 24, 2016   (JP) .............................. JP2016-207762

(51) Int. Cl.
*H05K 7/20*   (2006.01)
*H05K 7/14*   (2006.01)
*H01L 23/473*   (2006.01)

(52) U.S. Cl.
CPC ....... *H05K 7/20772* (2013.01); *H01L 23/473* (2013.01); *H05K 7/1487* (2013.01); *H05K 7/20272* (2013.01)

(58) Field of Classification Search
CPC ........... H05K 7/20272; H05K 7/20772; H05K 7/20254
See application file for complete search history.

(56) References Cited

U.S. PATENT DOCUMENTS

| | | | | |
|---|---|---|---|---|
| 1,913,573 A | * | 6/1933 | Turner ................... | F28D 1/0472 165/176 |
| 2,026,166 A | * | 12/1935 | Guarnaschelli ......... | F16L 33/26 285/334.5 |
| 4,278,836 A | * | 7/1981 | Bingham ............. | H02G 3/0468 174/109 |
| 5,105,054 A | * | 4/1992 | Kirma .................. | H01B 7/0045 174/2 |
| 5,297,586 A | * | 3/1994 | McIntosh ................ | F16L 33/26 138/109 |
| 5,335,819 A | * | 8/1994 | Martin .................... | B67D 1/06 222/129.1 |
| 5,422,787 A | * | 6/1995 | Gourdine ........... | H05K 7/20154 361/695 |

(Continued)

FOREIGN PATENT DOCUMENTS

| | | | |
|---|---|---|---|
| CN | 109378544 A | * | 2/2019 |
| JP | 09-130075 | | 5/1997 |

(Continued)

OTHER PUBLICATIONS

Japanese Office Action dated Sep. 15, 2020 for corresponding Japanese Patent Application No. 2016-207762 with English Translation, 17 pages.

*Primary Examiner* — Robert J Hoffberg
(74) *Attorney, Agent, or Firm* — Fujitsu Patent Center (57) ABSTRACT

An electronic device inserted into and removed from a slot that has a connection port, the electronic device includes a coupled part coupled to the connection port, and a corrugated metal pipe that has one end coupled to the coupled part and the other end fixed to a body of the electronic device, wherein the pipe has a first straight line part that extends along a direction of the insertion and removal and a second straight line part that extends along a direction orthogonal to a longitudinal direction of the first straight line part.

6 Claims, 13 Drawing Sheets

(56) References Cited

U.S. PATENT DOCUMENTS

| | | | | |
|---|---|---|---|---|
| 5,920,457 | A * | 7/1999 | Lamb | H01L 23/473 165/104.33 |
| 5,971,033 | A * | 10/1999 | Lanz | F16L 9/06 138/121 |
| 6,065,208 | A * | 5/2000 | Lamb | H01L 23/473 257/E23.098 |
| 6,111,749 | A * | 8/2000 | Lamb | H01L 23/473 361/699 |
| 6,494,497 | B1 * | 12/2002 | Kertesz | F16L 25/0045 285/222.1 |
| 6,530,419 | B1 * | 3/2003 | Suzuki | F28D 15/0241 165/104.33 |
| 6,619,331 | B1 * | 9/2003 | Suchdev | F01P 11/04 138/109 |
| 7,318,322 | B2 * | 1/2008 | Ota | H05K 7/20781 62/259.2 |
| 7,450,386 | B2 * | 11/2008 | Silverstein | F28D 15/0266 165/104.26 |
| 7,515,418 | B2 * | 4/2009 | Straznicky | H01L 23/4338 361/699 |
| 7,614,247 | B2 * | 11/2009 | Nicolai | H05K 7/20772 165/80.4 |
| 7,751,918 | B2 * | 7/2010 | Campbell | G06F 1/20 700/97 |
| 8,305,759 | B2 * | 11/2012 | Attlesey | H05K 7/20772 165/80.4 |
| 8,485,698 | B2 * | 7/2013 | Cheng | H01L 23/427 362/373 |
| 8,525,029 | B2 * | 9/2013 | Kato | B60R 16/0215 174/113 R |
| 9,161,477 | B2 * | 10/2015 | Demange | H05K 7/20218 |
| 9,351,428 | B2 * | 5/2016 | Eckberg | H05K 7/20772 |
| 9,420,724 | B2 * | 8/2016 | Pietrantonio | H05K 7/20509 |
| 9,505,358 | B2 * | 11/2016 | Ichikawa | B60R 16/0207 |
| 9,680,385 | B2 * | 6/2017 | Pietrantonio | H02M 3/33546 |
| 9,696,235 | B2 * | 7/2017 | Alshinnawi | H05K 7/20272 |
| 9,763,365 | B2 * | 9/2017 | Stocker | H05K 7/1497 |
| 9,943,016 | B2 * | 4/2018 | Pietrantonio | H05K 7/20927 |
| 9,995,510 | B2 * | 6/2018 | Wikus | G01R 33/3815 |
| 10,076,057 | B2 * | 9/2018 | Lodholz | H05K 7/20272 |
| 10,188,016 | B2 * | 1/2019 | Lunsman | F16L 37/12 |
| 10,237,999 | B2 * | 3/2019 | Lunsman | H05K 7/1489 |
| 10,405,458 | B2 | 9/2019 | Fukunaga | |
| 10,506,741 | B2 * | 12/2019 | Lodholz | H05K 7/20927 |
| 2004/0221604 | A1 | 11/2004 | Ota et al. | |
| 2006/0107678 | A1 | 5/2006 | Nicolai et al. | |
| 2010/0155040 | A1 * | 6/2010 | Hoffmann | F28D 1/0477 165/180 |
| 2010/0214740 | A1 * | 8/2010 | Silverstein | F28D 15/0266 361/679.52 |
| 2011/0313576 | A1 * | 12/2011 | Nicewonger | F28D 15/00 700/282 |
| 2014/0209272 | A1 * | 7/2014 | Stocker | H05K 7/1497 165/59 |
| 2016/0128228 | A1 * | 5/2016 | Pietrantonio | B32B 7/12 428/448 |
| 2016/0165752 | A1 * | 6/2016 | Pietrantonio | H05K 7/20927 165/121 |
| 2017/0127575 | A1 * | 5/2017 | Lunsman | F16L 37/12 |
| 2017/0135246 | A1 * | 5/2017 | Lunsman | H05K 7/20263 |
| 2018/0031329 | A1 * | 2/2018 | Wang | F28D 15/0241 |
| 2020/0053912 | A1 * | 2/2020 | Kim | H05K 7/20927 |
| 2020/0284522 | A1 * | 9/2020 | Chen | H05K 7/2039 |

FOREIGN PATENT DOCUMENTS

| | | |
|---|---|---|
| JP | 2002-261223 | 9/2002 |
| JP | 2003-313908 | 11/2003 |
| JP | 2004-246649 A | 9/2004 |
| JP | 2006-140485 A | 6/2006 |
| WO | WO-2012083337 A1 * | 6/2012 |

\* cited by examiner

Related Art

FIG. 8

| | EMBODIMENT | COMPARISON EXAMPLE ||
| --- | --- | --- | --- |
| | | METAL PIPE (COPPER OR ALUMINUM) | RESIN PIPE |
| FLEXIBILITY | ○ | × | △ |
| PRESSURE RESISTANCE | ○ | ○ | × |
| PIPE SIZE | ○ | ○ | × |
| SPACE FOR JOINT PART | ○ | ○ | × |

ELECTRONIC DEVICE

CROSS-REFERENCE TO RELATED APPLICATION

This application is based upon and claims the benefit of priority of the prior Japanese Patent Application No. 2016-207762, filed on Oct. 24, 2016, the entire contents of which are incorporated herein by reference.

FIELD

The embodiment discussed herein is related to an electronic device.

BACKGROUND

In an electronic device, various cooling mechanisms are used.

An electronic device that is inserted into and removed from a slot of a server device or the like may include a terminal of a cable coupled to an electric connector provided in the slot and various coupled parts such as a coupler coupled to a water supply and discharge port of a refrigerant. When the electronic device is inserted into or removed from the slot, a load is applied on a coupled part described above. With this, when dislocation due to a size tolerance or the like is present between a connection port for the slot and the coupled part, there is a possibility that this load is regularly applied on the coupled part. For this reason, when the coupler coupled to the water supply and discharge port of the refrigerant which is provided in the slot is supported by a water-cooled pipe made of metal, for example, it is desirable that the water-cooled pipe slightly moves due to an external force applied on the coupler. Furthermore, when the terminal of a cable coupled to the electric connector provided in the slot is supported by a pipe for cable made of metal, for example, it is desirable that the pipe for cable slightly moves due to an external force applied on the terminal.

The followings are reference documents.
[Document 1] Japanese Laid-open Patent Publication No. 9-130075,
[Document 2] Japanese Laid-open Patent Publication No. 2002-261223, and
[Document 3] Japanese Laid-open Patent Publication No. 2003-313908.

SUMMARY

According to an aspect of the invention, an electronic device inserted into and removed from a slot that has a connection port, the electronic device includes a coupled part coupled to the connection port, and a corrugated metal pipe that has one end coupled to the coupled part and the other end fixed to a body of the electronic device, wherein the pipe has a first straight line part that extends along a direction of the insertion and removal and a second straight line part that extends along a direction orthogonal to a longitudinal direction of the first straight line part.

The object and advantages of the invention will be realized and attained by means of the elements and combinations particularly pointed out in the claims.

It is to be understood that both the foregoing general description and the following detailed description are exemplary and explanatory and are not restrictive of the invention, as claimed.

DESCRIPTION OF EMBODIMENT

Hereinafter, an embodiment will be described. The embodiment described below is a mere example and is not intended to limit the technical scope of the present disclosure to the mode described below.

Figure 1:
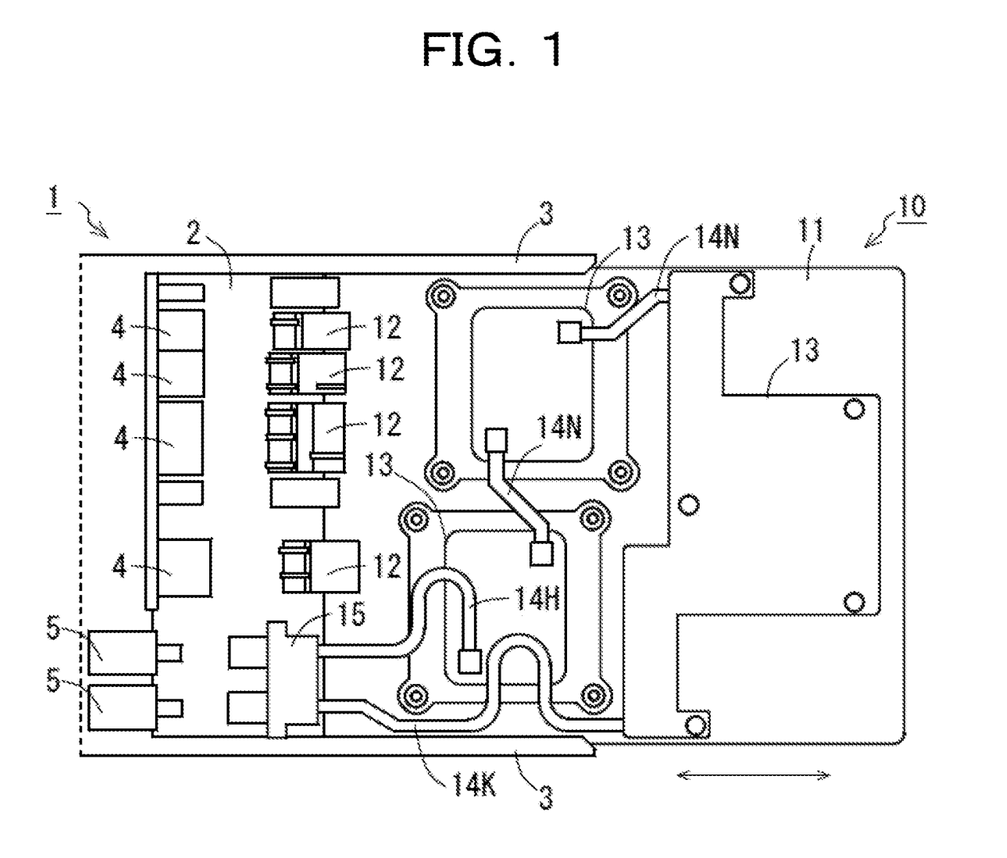
FIG. 1 is a diagram illustrating an electronic unit according to an embodiment.

FIG. 1 is a diagram illustrating an electronic unit according to an embodiment. An electronic unit 10 according to the embodiment is an electronic device that is inserted into and removed from a slot 2 of a server device 1. The electronic unit 10 includes a substrate 11 being a body of the electronic unit 10. The substrate 11 has a structure in which both side edges in the insertion direction fit into a groove 3 of the slot 2. To an edge at the front side in the insertion direction of the substrate 11, electric connectors 12 that are coupled to electric connectors 4 provided in the slot 2 are fixed. Furthermore, on the substrate 11, cold plates 13 for cooling heat generation components are provided. As heat generation components cooled by the cold plates 13, for example, an integrated circuit such as a central processing unit (CPU) or a memory, a power semiconductor, and various other heat generation components may be cited.

To the cold plates 13, water-cooled pipes 14H, 14K, and 14N are connected so that cooling water running through the water-cooled pipes 14H, 14K, and 14N passes through the cold plates 13. The water-cooled pipes 14N are corrugated (bellows-like) metal pipes connecting the cold plates 13 among each other. Furthermore, the water-cooled pipes 14H and 14K are corrugated metal pipes connected to a water-cooled pipe of the server device 1. The water-cooled pipes 14H and 14K each have one end connected to a water-cooled coupler 15 that is coupled to a water-cooled coupler 5 provided in the slot 2 and another end fixed to a cold plate 13.

Figure 2:
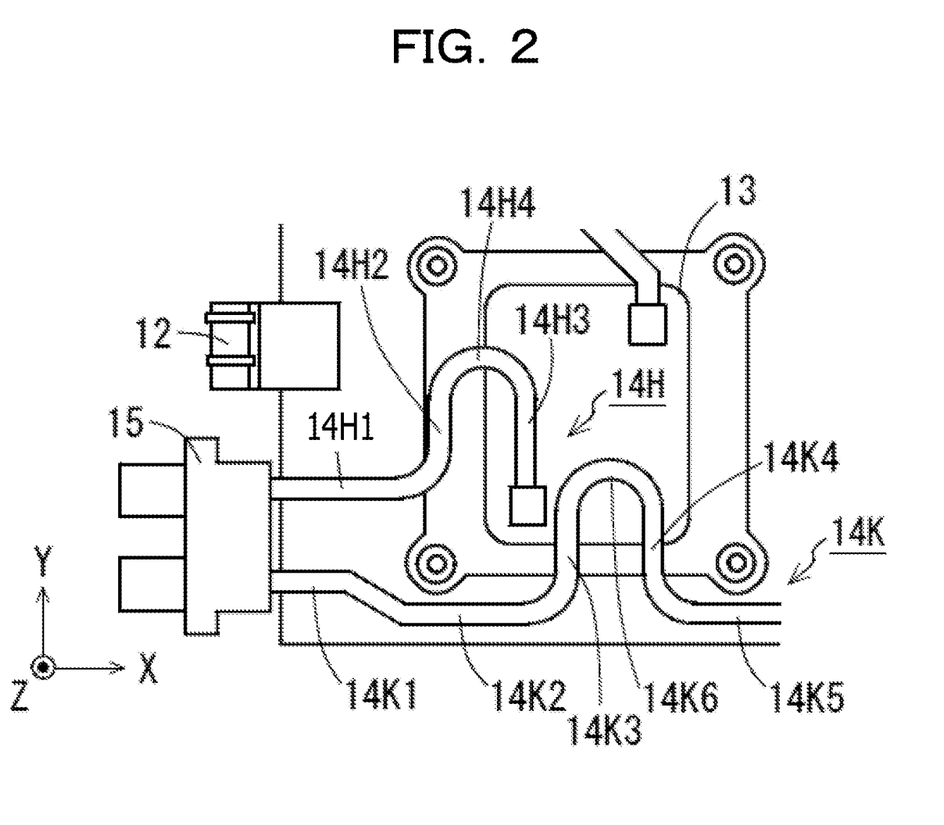
FIG. 2 is a diagram illustrating an enlarged view of a water-cooled coupler and a water-cooled pipe.

FIG. 2 is a diagram illustrating an enlarged view of the water-cooled coupler 15 and the water-cooled pipes 14H and 14K. As illustrated in FIG. 2, the water-cooled pipe 14H has a straight pipe part 14H1 (an example of a "first straight line part" according to the present application) extending along the insertion and removal direction of the electronic unit 10 from the water-cooled coupler 15 and straight pipe parts 14H2 and 14H3 (each being an example of a "second straight line part" according to the present application) extending in the direction orthogonal to the longitudinal direction of the straight pipe part 14H1. The straight pipe parts 14H2 and 14H3 communicate with a bent pipe part 14H4 (an example of a "curved part" according to the present application) having a semi-arc shape whose center angle forms approximately 180 degrees. The straight pipe parts 14H2 and 14H3 and the bent pipe part 14H4 thus form a U-shaped part in the water-cooled pipe 14H.

Furthermore, as illustrated in FIG. 2, the water-cooled pipe 14K has a straight pipe part 14K1 (an example of the "first straight line part" according to the present application) extending along the insertion and removal direction of the electronic unit 10 from the water-cooled coupler 15, a straight pipe part 14K2 (an example of the "first straight line part" according to the present application) extending along the insertion and removal direction further from the straight pipe part 14K1, and straight pipe parts 14K3 and 14K4 (each being an example of the "second straight line part" according to the present application) extending in the direction orthogonal to the longitudinal direction of the straight pipe parts 14K1 and 14K2. The straight pipe parts 14K3 and 14K4 communicate with a bent pipe part 14K6 (an example of the "curved part" according to the present application) having a semi-arc shape whose center angle forms approximately 180 degrees. The straight pipe parts 14K3 and 14K4 and the bent pipe part 14K6 thus form a U-shaped part in the water-cooled pipe 14K. The straight pipe part 14K4 is connected to a cold plate 13 via a straight pipe part 14K5 extending in the direction orthogonal to the longitudinal direction of the straight pipe part 14K4.

Figure 3:
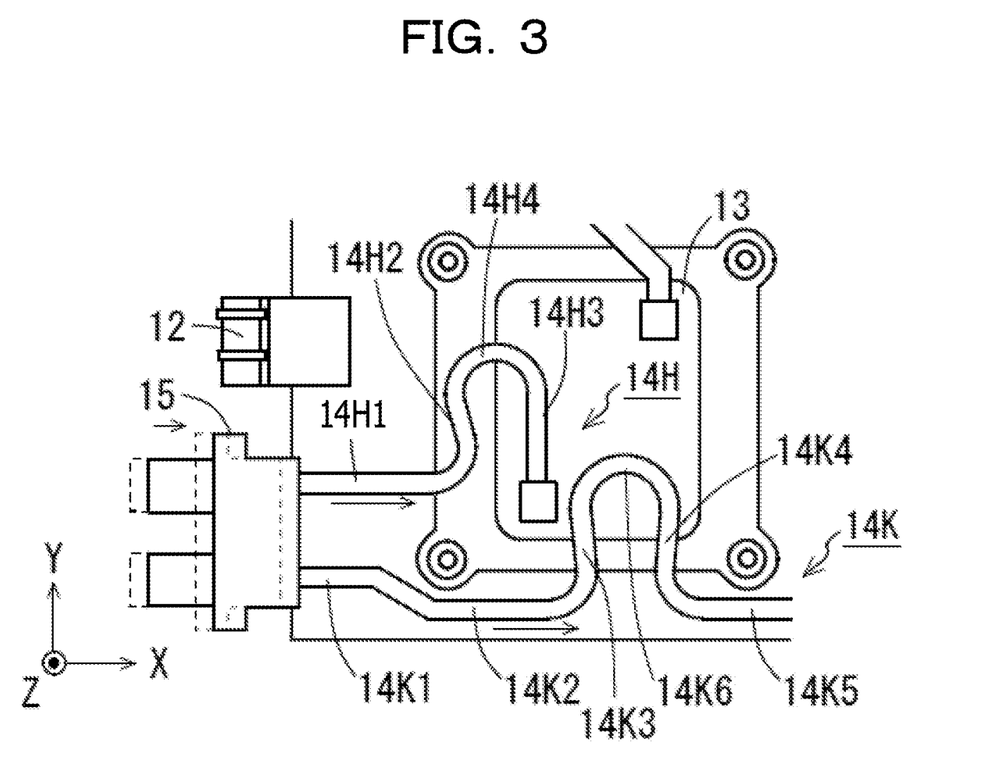
FIG. 3 is a first diagram illustrating a motion of the water-cooled pipe in a state in which a load is applied on the water-cooled coupler.

FIG. 3 is a first diagram illustrating a motion of the water-cooled pipes 14H and 14K in a state in which a load is applied on the water-cooled coupler 15. For example, when a load in the X-axis direction illustrated in FIG. 3 is applied on the water-cooled coupler 15, the load applied on the water-cooled coupler 15 is transmitted to the straight pipe part 14H1 of the water-cooled pipe 14H and the straight pipe part 14K1 of the water-cooled pipe 14K. The load transmitted to the straight pipe part 14H1 is transmitted to the straight pipe part 14H2, the bent pipe part 14H4, and the straight pipe part 14H3. The straight pipe part 14H2, the bent pipe part 14H4, and the straight pipe part 14H3 form a U-shaped part and thus are deformed by receiving the load transmitted from the straight pipe part 14H1. Furthermore, the load transmitted to the straight pipe part 14K1 is transmitted to the straight pipe part 14K3, the bent pipe part 14K6, and the straight pipe part 14K4 via the straight pipe part 14K2. The straight pipe part 14K3, the bent pipe part 14K6, and the straight pipe part 14K4 form a U-shaped part and thus are deformed by receiving the load transmitted from the straight pipe part 14K1 via the straight pipe part 14K2. The water-cooled pipes 14H and 14K each are deformed, whereby the water-cooled coupler 15 moves in the X-axis direction.

Figure 4:
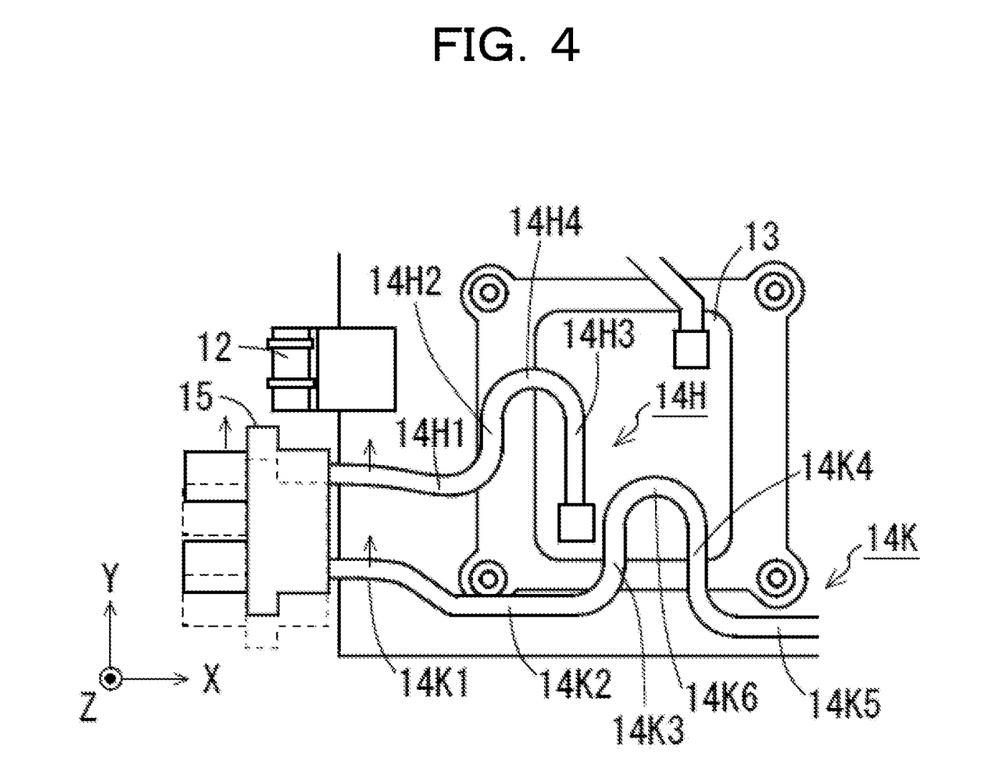
FIG. 4 is a second diagram illustrating a motion of the water-cooled pipe in a state in which a load is applied on the water-cooled coupler.

FIG. 4 is a second diagram illustrating a motion of the water-cooled pipes 14H and 14K in a state in which a load is applied on the water-cooled coupler 15. For example, when a load in the Y-axis direction illustrated in FIG. 4 is applied on the water-cooled coupler 15, the load applied on the water-cooled coupler 15 is transmitted to the straight pipe part 14H1 of the water-cooled pipe 14H and the straight pipe part 14K1 of the water-cooled pipe 14K. The straight pipe part 14H1 is formed laterally with respect to the direction of the load applied on the water-cooled coupler 15 and thus is deformed by receiving the load transmitted from the water-cooled coupler 15. Furthermore, the straight pipe parts 14K1 and 14K2 are formed laterally with respect to the direction of the load applied on the water-cooled coupler 15 and thus are deformed by receiving the load transmitted from the water-cooled coupler 15. The water-cooled pipes 14H and 14K each are deformed, whereby the water-cooled coupler 15 moves in the Y-axis direction.

Figure 5:
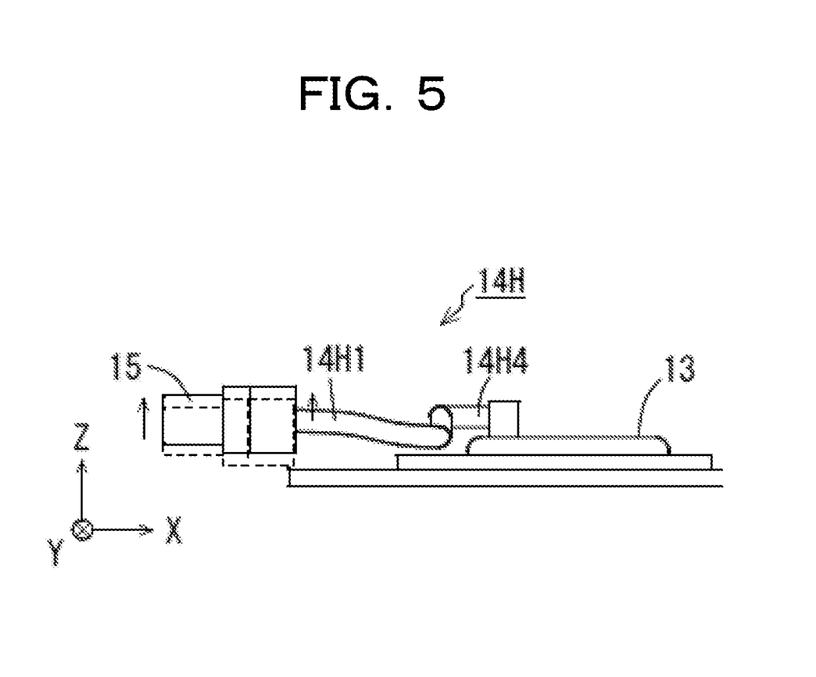
FIG. 5 is a third diagram illustrating a motion of the water-cooled pipe in a state in which a load is applied on the water-cooled coupler.

FIG. 5 is a third diagram illustrating a motion of the water-cooled pipe 14H in a state in which a load is applied on the water-cooled coupler 15. For example, when a load in the Z-axis direction illustrated in FIG. 5 is applied on the water-cooled coupler 15, the load applied on the water-cooled coupler 15 is transmitted to the straight pipe part 14H1 of the water-cooled pipe 14H and the straight pipe part 14K1 of the water-cooled pipe 14K. The straight pipe part 14H1 is formed laterally with respect to the direction of the load applied on the water-cooled coupler 15 and thus is deformed by receiving the load transmitted from the water-cooled coupler 15. Furthermore, the straight pipe part 14K1 is formed laterally with respect to the direction of the load applied on the water-cooled coupler 15 and thus is deformed by receiving the load transmitted from the water-cooled coupler 15. The water-cooled pipes 14H and 14K each are deformed, whereby the water-cooled coupler 15 moves in the Z-axis direction.

Figure 6:
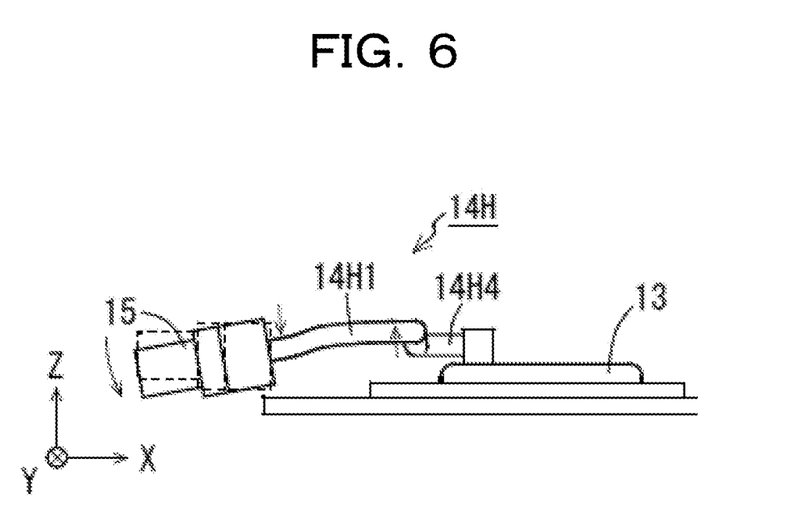
FIG. 6 is a fourth diagram illustrating a motion of the water-cooled pipe in a state in which a load is applied on the water-cooled coupler.

FIG. 6 is a fourth diagram illustrating a motion of the water-cooled pipe 14H in a state in which a load is applied on the water-cooled coupler 15. For example, when a rotational load around the Y axis illustrated in FIG. 6 is applied on the water-cooled coupler 15, the load applied on the water-cooled coupler 15 is transmitted to the straight pipe part 14H1 of the water-cooled pipe 14H and the straight pipe part 14K1 of the water-cooled pipe 14K, whereby the straight pipe parts 14H1 and 14K1 each are deformed. Furthermore, the load transmitted to the straight pipe part 14H1 is transmitted to the bent pipe part 14H4 via the straight pipe part 14H2. The straight pipe part 14H2 is formed in parallel with the Y axis in a position decentered from the water-cooled coupler 15 on which the rotational load around the Y axis is applied and thus is deformed by receiving the load transmitted from the water-cooled coupler 15. Furthermore, the load transmitted to the straight pipe part 14K1 is transmitted to the straight pipe part 14K3 via the straight pipe part 14K2. The straight pipe part 14K3 is formed in parallel with the center axis in a position decentered from the center axis of the rotational load applied on the water-cooled coupler 15 and thus is deformed by receiving the load transmitted from the water-cooled coupler 15. The water-cooled pipes 14H and 14K each are deformed, whereby the water-cooled coupler 15 moves along the rotational load around the Y axis.

Figure 7:
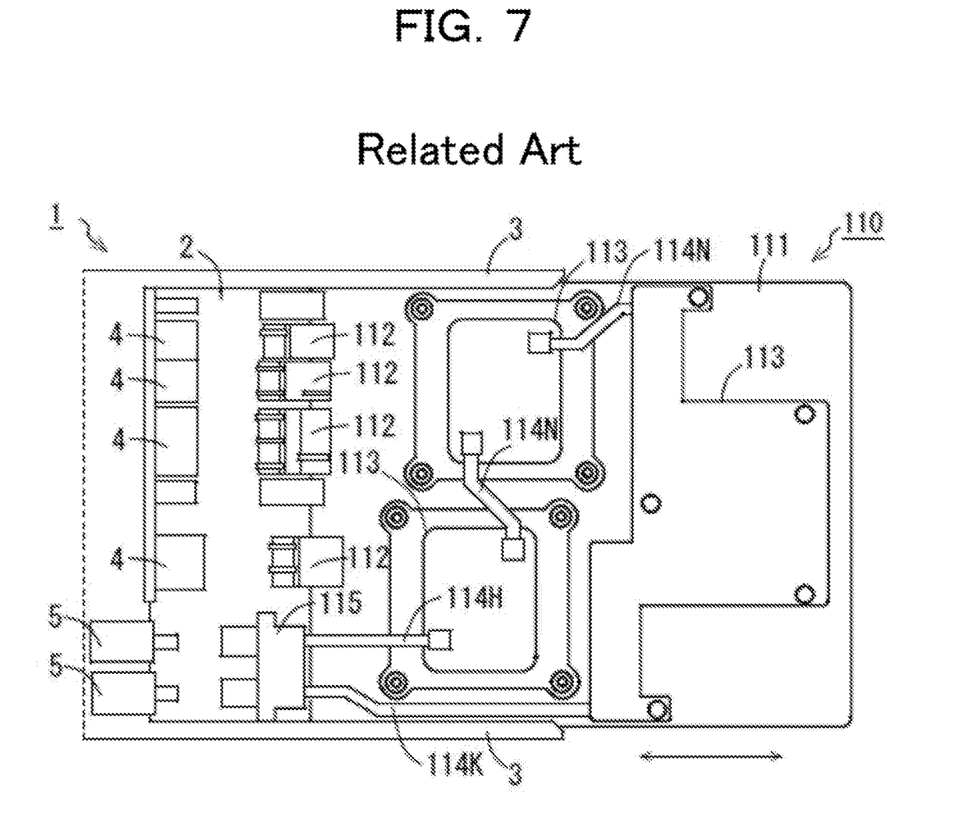
FIG. 7 is a diagram illustrating an electronic unit according to a comparison example.

FIG. 7 is a diagram illustrating an electronic unit according to a comparison example. An electronic unit 110 according to the comparison example is an electronic device inserted into and removed from the slot 2 of the server 1, similarly to the electronic unit 10 according to the embodiment. The electronic unit 110 includes a substrate 111. To an edge at the front side in the insertion direction of the substrate 111, an electric connector 112 is fixed. Furthermore, on the substrate 111, cold plates 113 are provided. To the cold plates 113, water-cooled pipes 114H, 114K, and 114N are connected so that cooling water running through the water-cooled pipes 114H, 114K, and 114N passes through the cold plates 113. The water-cooled pipes 114H and 114K each have one end connected to a water-cooled coupler 115 that is coupled to a water-cooled coupler 5 and another end fixed to a cold plate 113. The water-cooled pipes 114H and 114K have no U-shaped part and are straight pipes or substantially straight pipes.

Figure 8:
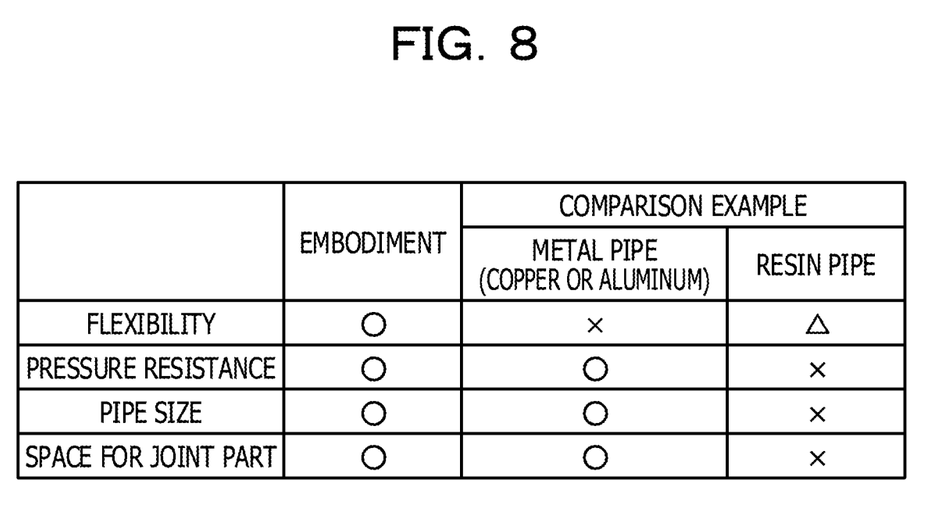
FIG. 8 is a table illustrating a verification result.

FIG. 8 is a table illustrating a verification result. A verification of an effect of the embodiment has revealed that flexibility of the water-cooled coupler 15 is good regardless of the direction of the load, that is, good in directions such as the X-axis direction, the Y-axis direction, and the Z-axis direction. Furthermore, the water-cooled pipes 14H and 14K are metal pipes and thus have high pressure resistance. Furthermore, because the water-cooled pipes 14H and 14K are metal pipes, the wall thicknesses thereof are able to be made thinner than that of a resin pipe, thereby enabling to reduce the sizes of the pipes. Furthermore, because the water-cooled pipes 14H and 14K are metal pipes, the strengths thereof are higher than that of a resin pipe, thereby enabling to reduce the size of the joint part.

By contrast, in the case of the comparison example, when the water-cooled pipes 114H and 114K are formed by metal pipes, the water-cooled coupler 115 has almost no flexibility. Furthermore, when the water-cooled pipes 114H and 114K are formed by resin pipes, a small degree of flexibility may be obtained with the water-cooled coupler 115, but with respect to all of the pressure resistance, the pipe sizes, and the size of the joint part, resin pipes are inferior to metal pipes.

From the verification result described above, it is found that the water-cooled coupler 15 of the electronic unit 10 according to the embodiment is more flexible and superior in pressure resistance and the like than the water-cooled coupler 115 of the electronic unit 110 according to the comparison example.

On the water-cooled coupler 15 coupled to the water-cooled coupler 5, a load is applied when the electronic unit 10 is inserted into and removed from the slot 2. Furthermore, when dislocation due to a size tolerance or the like is present between the water-cooled coupler 5 and the water-cooled coupler 15, in a state in which the electronic unit 10 is inserted into the slot 2, regular loads are applied on the water-cooled coupler 15. For this reason, it is desirable that the water-cooled coupler 15 slightly moves relative to the substrate 11 of the electronic unit 10. In this respect, the water-coupler 15 is a metal pipe but is able to slightly move relative to the substrate 11 because the water-cooler coupler 15 is fixed to the substrate 11 via the water-cooled pipes 14H and 14K whose routes are drawn around so as to exert flexibility. With this, the electronic unit 10 in the embodiment described above is able to absorb variations in position accuracy due to a size tolerance or the like of the water-coupler 15 using the water-cooled pipes 14H and 14K having flexibility. Furthermore, in the electronic unit 10 in the embodiment described above, because the shapes of the water-cooled pipes 14H and 14K return to the initial shapes after removal from the slot 2, the water-cooled pipes 14H and 14K are able to absorb variations repeatedly.

Figure 9:
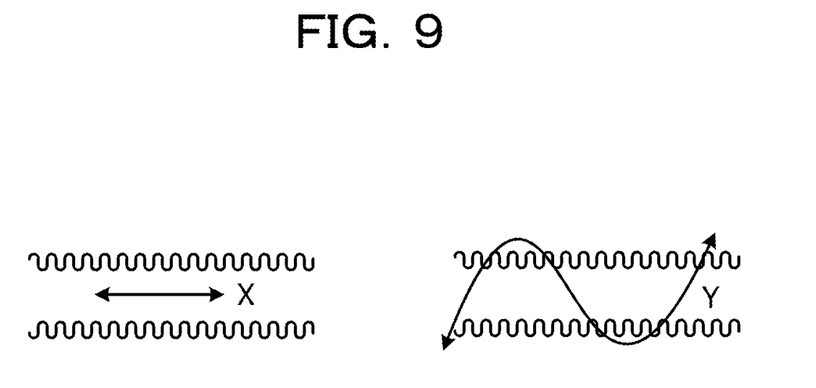
FIG. 9 is a diagram illustrating a direction of a load applied on a corrugated metal pipe.

FIG. 9 is a diagram illustrating a direction of a load applied on a corrugated metal pipe. For example, even in the case of a corrugated metal pipe referred to as to a flexible pipe or a bellows pipe, the movable amounts in the direction illustrated by a reference character X and in the twisting direction illustrated by a reference character Y in FIG. 9 are small. In this respect, as with the water-cooled pipe 14H included in the electronic unit 10 according to the embodiment described above, deformation is able to develop with flexibility responding to a load received from the water-cooled coupler 15 when the straight pipe parts 14H2 and 14H3 extending along the direction orthogonal to the longitudinal direction of the straight pipe part 14H1 are present in addition to the straight pipe part 14H1 extending the insertion and removal direction. However, the water-cooled pipes 14H and 14K are not limited to normal metal pipes that have flat peripheral surfaces and may be corrugated metal pipes, for example, as illustrated in FIG. 9.

Figure 10:
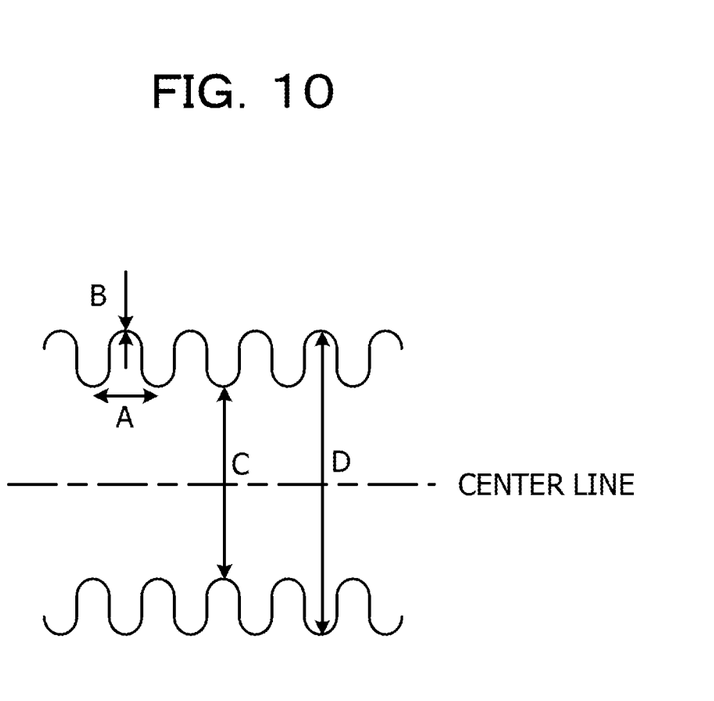
FIG. 10 is a diagram illustrating a position to be noted when a corrugated metal pipe is employed as the water-cooled pipe.

FIG. 10 is a diagram illustrating a position to be noted when corrugated metal pipes are employed as the water-cooled pipes 14H and 14K. When corrugated metal pipes are employed as the water-cooled pipes 14H and 14K, the interval between waves (see a reference character A in FIG. 10), the wall thickness of the pipe (see a reference character B in FIG. 10), the inner diameter at a wave trough part (see a reference character C in FIG. 10), and the inner diameter at a wave crest part (see a reference character D in FIG. 10) are decided as appropriate in accordance with various design conditions such as flexibility, pressure resistance, pressure loss demanded for the water-cooled pipes 14H and 14K. The sizes of various parts illustrated with reference characters A to D in FIG. 10 are decided as appropriate, whereby the water-cooled coupler 15 supported by the water-cooled pipes 14H and 14K have appropriate strengths and flexibility.

It is to be noted that the shapes of the water-cooled pipes in the electronic device disclosed by the present application are not limited to those of the water-cooled pipes 14H and 14K included in the electronic unit 10 according to the embodiment. Modifications of the water-cooled pipes 14H and 14K will be described below.

Figure 11:
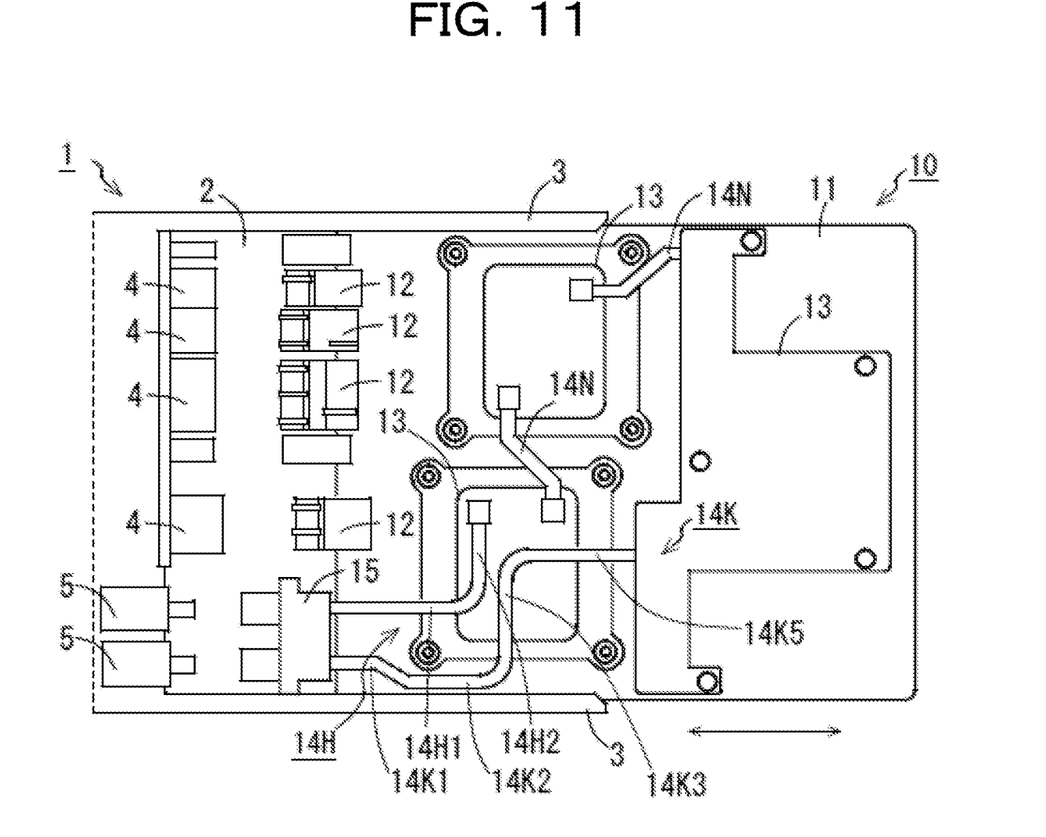
FIG. 11 is a diagram illustrating a first modification of the water-cooled pipe.

FIG. 11 is a diagram illustrating a first modification of the water-cooled pipes 14H and 14K. The water-cooled pipe 14H may be a pipe that only has the straight pipe part 14H1 extending along the insertion and removal direction of the electronic unit 10 from the water-cooled coupler 15 and the straight pipe part 14H2 extending in the direction orthogonal to the longitudinal direction of the straight pipe part 14H1, for example, as illustrated in FIG. 11. Furthermore, from the water-cooled pipe 14K, the bent pipe part 14K6 and the straight pipe part 14K4 are omitted and the straight pipe part 14K3 directly communicate with the straight pipe part 14K5, for example, as illustrated in FIG. 11. That is to say, in the present modification, the straight pipe part 14H3 and the bent pipe part 14H4 are omitted from the water-cooled pipe 14H and the water-cooled pipe 14H is formed in an L shape. Furthermore, the straight pipe part 14K4 and the bent pipe part 14K6 are omitted from the water-cooled pipe 14K and the water-cooled pipe 14K is formed to have an L-shaped part. The present first modification enables to support the water-cooled coupler 15 with appropriate strength and flexibility, as in the embodiment.

Figure 12:
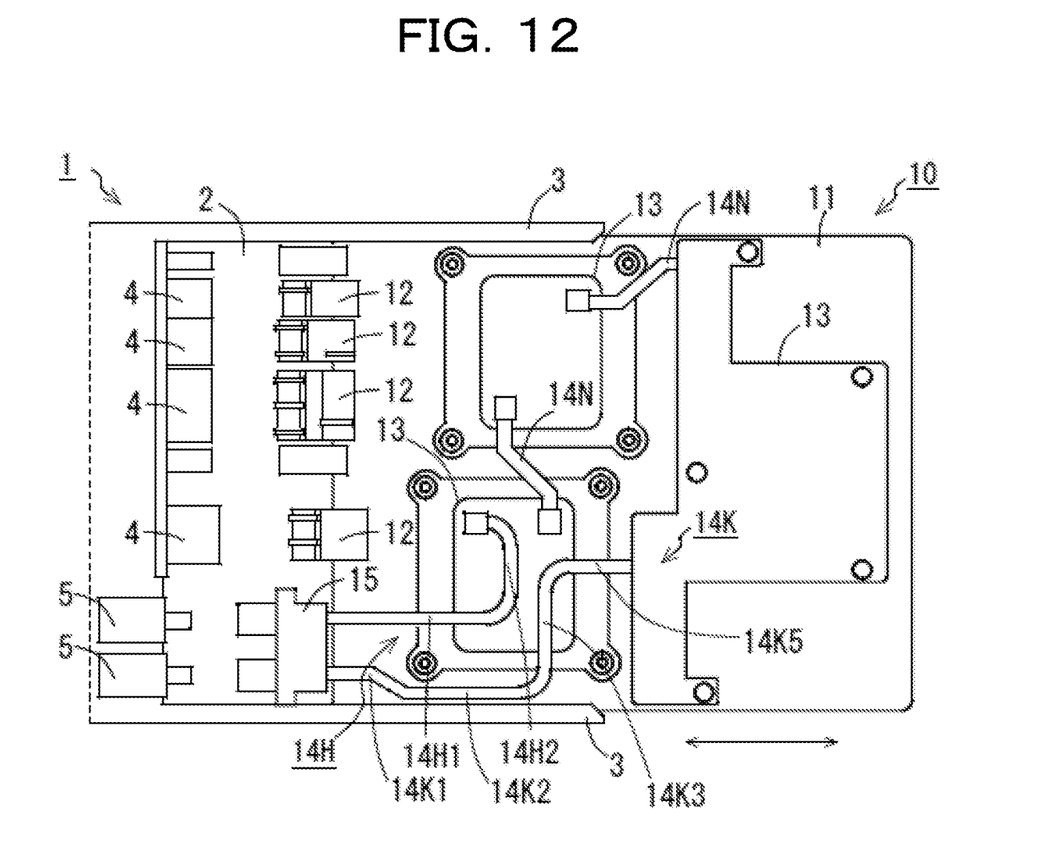
FIG. 12 is a diagram illustrating a second modification of the water-cooled pipe.

FIG. 12 is a diagram illustrating a second modification of the water-cooled pipes 14H and 14K. The water-cooled pipe 14H may be a pipe that only has the straight pipe part 14H1 extending along the insertion and removal direction of the electronic unit 10 from the water-cooled coupler 15 and the straight pipe part 14H2 extending in the direction orthogonal to the longitudinal direction of the straight pipe part 14H1, for example, as illustrated in FIG. 12. Furthermore, the tip of the straight pipe part 14H2 may be bent toward the insertion direction of the electronic unit 10, so that the water-cooled pipe 14H is formed to look like a J shape. The present second modification enables to support the water-cooled coupler 15 with appropriate strength and flexibility, as in the embodiment and the first modification.

Furthermore, the electronic device disclosed by the present application is not limited to one having a water-cooled pipe. A modification of the electronic unit 10 according to the embodiment described above will be described below.

Figure 13:
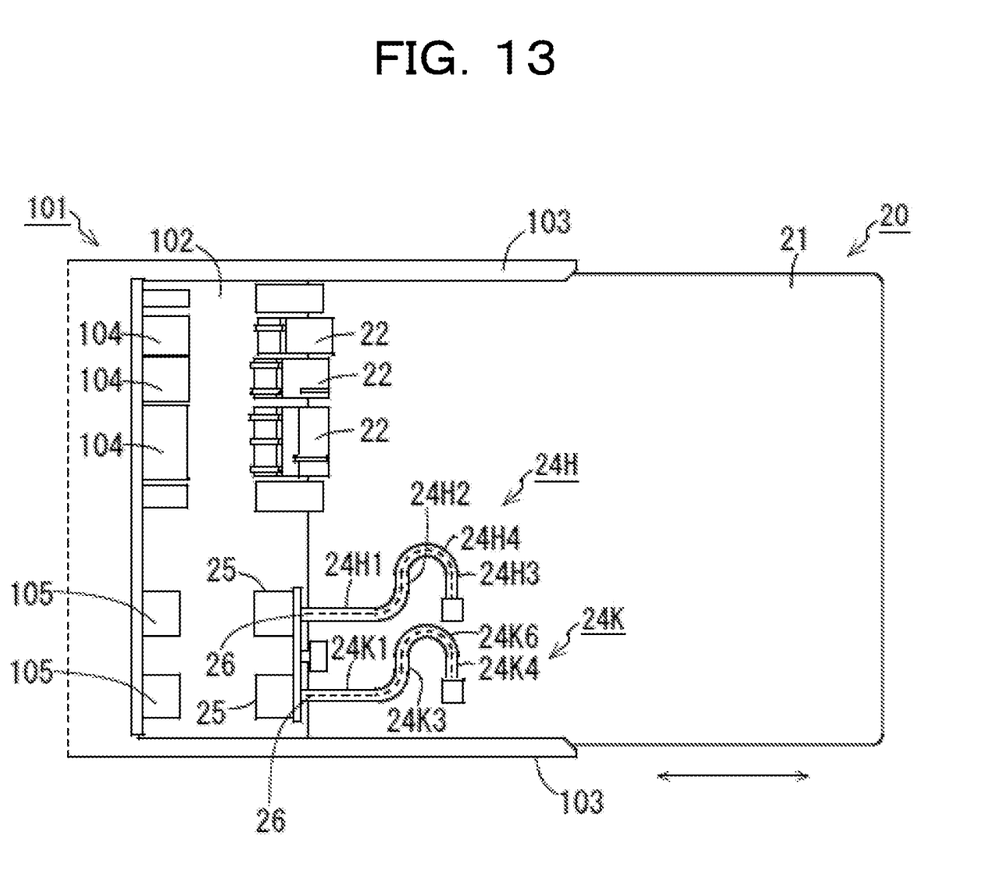
FIG. 13 is a diagram illustrating an electronic unit according to a modification.

FIG. 13 is a diagram illustrating an electronic unit according to a modification. An electronic unit 20 according to the modification is an electronic device that is inserted into and removed from a slot 102 of a server device 101, as in the electronic unit 10 according to the embodiment. The electronic unit 20 includes a substrate 21 being a body of the electronic unit 20. The substrate 21 has a structure in which both side edges in the insertion direction fit into a groove 103 of the slot 102. To an edge at the front side in the insertion direction of the substrate 21, electric connectors 22 that are coupled to electric connectors 104 provided in the slot 102 are fixed.

Furthermore, to the substrate 21, pipes for cable 24H and 24K for supporting terminals 25 coupled to the electric connectors 105 provided in the slot 102 are fixed. In the pipes for cable 24H and 24K, cables 26 connecting the terminals 25 and the substrate 21 are incorporated.

The pipe for cable 24H has a straight pipe part 24H1 (an example of the "first straight line part" according to the present application) extending along the insertion and removal direction of the electronic unit 20 from a terminal 25 and straight pipe parts 24H2 and 24H3 (each being an example of the "second straight line part" according to the present application) extending in the direction orthogonal to the longitudinal direction of the straight pipe part 24H1, as in the water-cooled pipe 14H. The straight pipe parts 24H2 and 24H3 communicate with a bent pipe part 24H4 (an example of the "curved part" according to the present application) having a semi-arc shape whose center angle forms approximately 180 degrees. The straight pipe parts 24H2 and 24H3 and the bent pipe part 24H4 thus form a U-shaped part in the pipe for cable 24H.

Furthermore, the pipe for cable 24K has a straight pipe part 24K1 (an example of the "first straight line part" according to the present application) extending along the insertion and removal direction of the electronic unit 20 from a terminal 25 and straight pipe parts 24K3 and 24K4 (each being an example of the "second straight line part" according to the present application) extending in the direction orthogonal to the longitudinal direction of the straight pipe part 24K1, as in the water-cooled pipe 14K. The straight pipe parts 24K3 and 24K4 communicate with a bent pipe part 24K6 (an example of the "curved part" according to the present application) having a semi-arc shape whose center angle forms approximately 180 degrees. The straight pipe parts 24K3 and 24K4 and the bent pipe part 24K6 thus form a U-shaped part in the pipe for cable 24K. The straight pipe parts 24K4 is connected to the substrate 21 via the straight pipe part 24K5 extending in the direction orthogonal to the longitudinal direction of the straight pipe part 24K4.

The present modification is able to support the terminals 25 with appropriate strength and flexibility, as in the embodiment.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiment of the present invention has been described in detail, it should be understood that the various changes, substitutions, and alterations could be made hereto without departing from the spirit and scope of the invention.

What is claimed is:

1. An electronic device inserted into and removed from a slot that has a second coupled part for supplying or discharging water, the electronic device comprising:
   a first coupled part to be coupled to the second coupled part for the supplying or discharging water; and
   a water-cooled pipe that has one end connected to the first coupled part and another end fixed to a cold plate which cools a heat generation component, and that moves in response to a load applied to the first coupled part,
   the water-cooled pipe has:
      a first straight pipe part that extends along a direction of insertion and removal, and
      a second straight pipe part that extends along a direction orthogonal to the first straight pipe part, the water-cooled pipe:
      moves so that the water-cooled pipe deforms into a first form when the load is in a first direction,
      moves so that the water-cooled pipe deforms into a second form different from the first form when the load is in a second direction,
      moves so that the water-cooled pipe deforms into a third form different from the first form and the second form when the load is in a third direction, and
      the first direction, the second direction, and the third direction are orthogonal each other,
   the water-cooled pipe is a corrugated metal pipe which includes, an interval between waves, a wall thickness of the water-cooled pipe, a first inner diameter which is configured between wave trough parts, and a second inner diameter which is configured between wave crest parts, and
   at least one of the interval, the wall thickness, the first inner diameter, or the second inner diameter is set according to a flexibility demand for the water-cooled pipe.

2. The electronic device according to claim 1, wherein the water-cooled pipe has a third straight pipe part that extends along the direction orthogonal to the first straight pipe part and a bent pipe part that ties the second straight pipe part and the third straight pipe part.

3. The electronic device according to claim 1, further comprising:
   a first electric connector of the electronic device to be coupled to a second electric connector provided in the slot, wherein
   the first coupled part and the first electric connector are located on a same side of the electronic device in a same direction.

4. The electronic device according to claim 1, further comprising:
   a substrate, wherein
   the water-cooled pipe is located on the substrate and extends along the direction of insertion and removal parallel to the substrate, and
   the water-cooled pipe is directly connected to the first coupled part.

5. The electronic device according to claim 1, wherein the water-cooled pipe has a U-shaped part, the U-shaped part has a center line, the center line extends in a direction perpendicular to the direction of insertion and removal.

6. The electronic device according to claim 1, wherein each of the interval, the wall thickness, the first inner diameter, and the second inner diameter are set according to the flexibility demand for the water cooled pipe.

\* \* \* \* \*